(12) United States Patent
Wang et al.

(10) Patent No.: US 12,419,013 B2
(45) Date of Patent: Sep. 16, 2025

(54) HEAT-AND-COLD RECOVERY SYSTEM BASED ON LIQUID COOLING DATA CENTER

(71) Applicant: Hangzhou Keencool Intelligent Technology Co., Ltd., Hangzhou (CN)

(72) Inventors: Ning Wang, Hangzhou (CN); Shitong Liu, Hangzhou (CN); Lingyun Wang, Hangzhou (CN); Yao Yao, Hangzhou (CN); Yi Sun, Hangzhou (CN); Bin Shen, Hangzhou (CN)

(73) Assignee: Hangzhou Keencool Intelligent Technology Co., Ltd., Hangzhou (CN)

( * ) Notice: Subject to any disclaimer, the term of this patent is extended or adjusted under 35 U.S.C. 154(b) by 220 days.

(21) Appl. No.: 18/317,238

(22) Filed: May 15, 2023

(65) Prior Publication Data
US 2024/0206118 A1 Jun. 20, 2024

(30) Foreign Application Priority Data

Dec. 16, 2022 (CN) .......................... 202211623596.1
Dec. 16, 2022 (CN) .......................... 202223383630.0

(51) Int. Cl.
*H05K 7/20* (2006.01)
*F25B 25/02* (2006.01)

(52) U.S. Cl.
CPC ......... *H05K 7/20327* (2013.01); *F25B 25/02* (2013.01); *H05K 7/20354* (2013.01); *H05K 7/20363* (2013.01); *H05K 7/20827* (2013.01)

(58) Field of Classification Search
CPC ............ H05K 7/20827; H05K 7/2079; H05K 7/20363
See application file for complete search history.

(56) References Cited

U.S. PATENT DOCUMENTS

| 2016/0143190 A1* | 5/2016 | Campbell | ............... F25B 27/02 60/651 |
| 2017/0105313 A1* | 4/2017 | Shedd | ................ H05K 7/20309 |
| 2022/0346265 A1* | 10/2022 | Heydari | ............ H01M 8/04156 |

* cited by examiner

*Primary Examiner* — Lionel Nouketcha
(74) *Attorney, Agent, or Firm* — Laine IP Oy

(57) ABSTRACT

Heat-and-cold recovery system based on liquid cooling data center (energy storage power station) includes high-temperature heat pump, pressure-less heat-storage tank, pressurized heat-storage tank, absorption-type water chiller group, compression-type water chiller group, water cold-storage tank, and PCM cold-storage tank. High-temperature heat pump forms circulating heat-exchange loops with CDU and with pressure-less heat-storage tank; hot-water output interface of pressure-less heat-storage tank connects to pressurized heat-storage tank through first circulating pump set and pipeline heater sequentially; pressurized heat-storage tank stores and outputs hot water/steam; pressurized heat-storage tank connects to absorption-type water chiller group through second circulating pump set and forms circulating heat-exchange loop with pressure-less heat-storage tank through absorption-type water chiller group; absorption-type water chiller group forms circulating heat-exchange loop with computer-room air-cooling region; compression-type water chiller group connects to water/PCM cold-storage tank, which stores cooling water of compression-type water chiller group for heat exchange to CDU and/or computer-room air-cooling region.

13 Claims, 1 Drawing Sheet

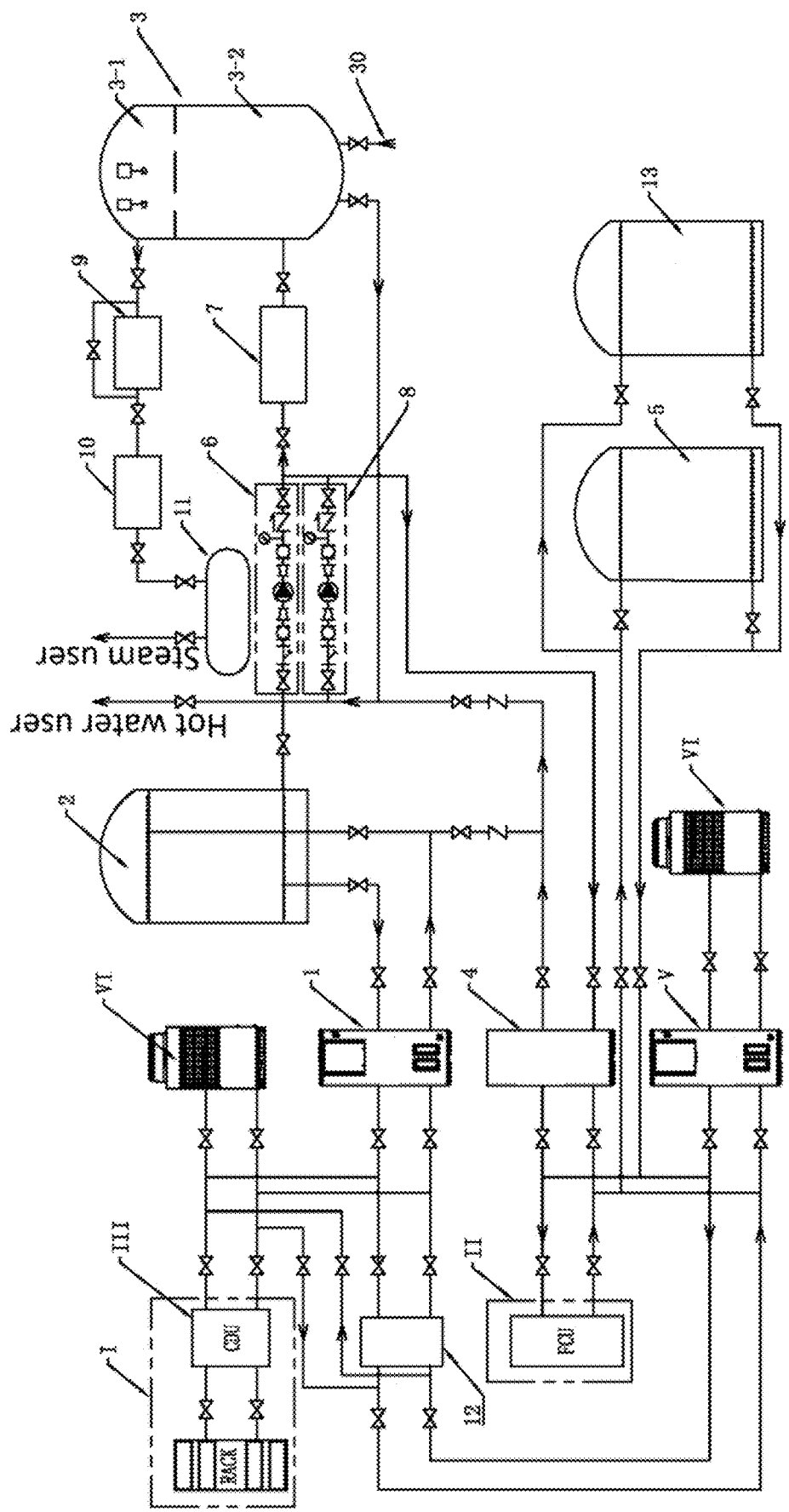

HEAT-AND-COLD RECOVERY SYSTEM BASED ON LIQUID COOLING DATA CENTER

CROSS-REFERENCE TO RELATED APPLICATIONS

The present disclosure claims priority to Chinese patent application No. 202211623596.1, filed with the China Patent Office on Dec. 16, 2022, and Chinese patent application No. 202223383630.0, filed with the China Patent Office on Dec. 16, 2022, the entire content of which is incorporated by reference.

TECHNICAL FIELD

The present disclosure belongs to the field of energy comprehensive utilization technology, in particular to a heat-and-cold recovery system based on liquid cooling data center.

BACKGROUND ART

The total energy consumption of data center is rising annually, so the energy consumption situation is serious. Based on the principle of refrigeration, only liquid cooling data centers are capable of achieving the PUE to be less than 1.2 or even 1.1. In addition, based on energy security, the electric power substitution, and the peak-load shifting, temperature control is extremely important for the life and safety of the battery system, due to the increasing scale of the electrochemical energy storage power station; the higher capacity and power of battery for the energy storage battery system; the relatively high requirement of heat-dissipation for high power density; and the problems such as heat generation of battery and uneven distribution of temperature which are prone to occur inside the energy storage system. In particular, submerged liquid cooling technology enables the energy storage battery to be submerged in liquid, which better prevents thermal runaway and thermal spread and provides higher fire safety. Liquid cooling solutions are the future of industrial cooling.

Liquid cooling technology includes single-phase immersion type, two-phase immersion type, spray type, and cold plate type. Compared with traditional data center cooling technology that uses air as the medium, the advantage of liquid cooling technology is that the heat dissipation capacity of liquid cooling technology is thousands of times that of air cooling. Because of the huge difference in the physical properties of liquid and air, liquid cooling data centers and liquid cooling energy storage stations can provide low-grade heat sources around 35 to 50° C. all year round, which are high-quality heat sources used by heat pumps. In addition, the heat exchanger of the liquid cooling system has a larger heat transfer coefficient, which enables the smaller heat transfer area, the lower cost, and the more compact equipment; and liquid cooling technology and resources used by the heat pumps are able to naturally complement each other.

The low-temperature heat sources of existing heat pump systems are mainly from air, soil, and all categories of water resources, however, in which there are generally defects. How to obtain a stable high-quality low-temperature heat source is the sore point of large-scale application of heat pump technology, but it is the advantages of liquid cooling technology. Regarding the difference between the demand and supply-demand relationship and time scale, there are now also cases of large-scale cross-season heat storage. The heat grade difference between the low-temperature heat source and the high-temperature demand can also be solved by heat pump technology.

Generally speaking, the high-temperature heat pump refers to the heat pump that can heat the water temperature above 85° C., while the heat pump that can heat the water temperature to 65° C. is called a medium-temperature heat pump or medium-high temperature heat pump. The emergence of high-temperature heat pumps has greatly expanded the application fields of heat pumps, which can directly recycle low-grade residual (waste) heat resources of 20° ° C. to 55° C. to produce hot water of 65° C. to 90° C.

If the heating temperature exceeds 100° C., it is theoretically possible to generate steam at atmospheric pressure; and such heat pumps can be used as steam generators to meet the needs of industry and daily life, i.e., brewing, drying, and many other industrial scenarios. High-temperature heating equipment has great industry prospects.

In general, during the working process of the heat pump, the evaporator absorbs heat and the condenser releases heat, in which cold and hot media are produced simultaneously. Liquid cooling data centers and energy storage power stations can disable cooling towers, cooling-water machines, or other cold source equipment to further reduce PUE; and the generated heat can be stored in containers or directly supplied outside, realizing the graded utilization of electric energy and residual heat recovery in liquid cooling data centers or liquid cooling energy storage power stations. In addition, according to the construction level, in A-class and B-class data centers, the minimum backup time for batteries in uninterruptible power supply system needs to be set at 15 min and 7 min of backup time (when diesel generators are used as backup power). The configuration capacity of diesel generators includes the backup diesel power-generation capacity of the uninterruptible power supply system and the basic capacity of the base machine of the air conditioner and the refrigeration equipment. The load of the data centers is relatively large, and if there are heat sources above 90° C. in the system, the low electrical load demand of absorption (adsorption) heat pumps can be used to significantly reduce the cost of UPS configurations and the capacity of backup power sources such as diesel generators, thereby significantly reducing investment costs.

SUMMARY

Based on the aforementioned disadvantages and deficiencies in the prior art, one of the objects of the present disclosure is to solve at least one or more of the aforementioned problems in the prior art. In other words, one of the objects of the present disclosure is to provide a heat-and-cold recovery system based on liquid cooling data center, which satisfies one or more of the aforementioned needs.

To achieve the above-mentioned objects, the present disclosure uses the following technical solutions.

In a heat-and-cold recovery system based on liquid cooling data center, the liquid cooling data center is provided with a computer-room liquid-cooling region and a computer-room air-cooling region. A first circulating heat-exchange loop is formed by the computer-room liquid-cooling region and a coolant distribution unit, and a second circulating heat-exchange loop is formed by the coolant distribution unit and a first cooling tower. The heat exchange is conducted by the first circulating heat-exchange loop and the second circulating heat-exchange loop. A third circulating heat-exchange loop is formed by the computer-room air-cooling region and the compression-type water chiller group, and a fourth circulating heat-exchange loop is formed by the compression-type water chiller group and a second cooling tower. The heat exchange is conducted by the third circulating heat-exchange loop and the fourth circulating heat-exchange loop. The heat-and-cold recovery system comprises a high-temperature heat pump, a pressure-less heat-storage tank, a pressurized heat-storage tank, an absorption-type water chiller group and a water cold-storage tank.

The high-temperature heat pump and the coolant distribution unit form a fifth circulating heat-exchange loop, and the fifth circulating heat-exchange loop conducts the heat exchange with the first circulating heat-exchange loop.

The high-temperature heat pump and the pressure-less heat-storage tank form a sixth circulating heat-exchange loop, and the sixth circulating heat-exchange loop conducts the heat exchange with the fifth circulating heat-exchange loop, wherein the pressure-less heat-storage tank is provided with a hot-water output interface for outputting hot water to the hot-water user side.

The hot-water output interface of the pressure-less heat-storage tank is further connected to the pressurized heat-storage tank through a first circulating pump set and a pipeline heater in sequence; and the pressurized heat-storage tank is configured to output steam.

The pressurized heat-storage tank is further connected to the absorption-type water chiller group through a second circulating pump set and forms a seventh circulating heat-exchange loop with the pressure-less heat-storage tank through the absorption-type water chiller group, wherein the second circulating pump set is connected in parallel with the first circulating pump set.

The absorption-type water chiller group and the computer-room air-cooling region form an eighth circulating heat-exchange loop, and the eighth circulating heat-exchange loop conducts the heat exchange with the seventh circulating heat-exchange loop.

The compression-type (absorption-type) water chiller group is connected to a water (PCM) cold-storage tank; and the water (PCM) cold-storage tank is configured to store the cooling water from the compression-type water chiller group for heat exchange to the coolant distribution unit and/or the computer-room air-cooling region.

As a preferred solution, steam output interface of the pressurized heat-storage tank is connected to a steam generator, a gas-liquid separator, and a gas distributing cylinder in sequence, for supplying to the steam user side.

As a preferred solution, direct by-passes are connected in parallel to both ends of the steam generator.

As a preferred solution, the pressurized heat-storage tank is divided into a steam region and a hot-water region, in which the steam region is located above the hot-water region and the steam output interface communicates with the steam region.

The hot-water region of the pressurized heat-storage tank is provided with an upper-annular water distributor and a lower-annular water distributor; and the upper-annular water distributor is connected to the pipeline heater and the lower-annular water distributor is connected to the second circulating pump set.

As a preferred solution, the pressurized heat-storage tank is provided with a water-refilling inlet.

As a preferred solution, the pressure-less heat-storage tank is provided with an upper water distributor and a lower water distributor therein; and the upper water distributor and the lower water distributor are the input and output of the sixth circulating heat-exchange loop corresponding to the pressure-less heat-storage tank, respectively.

As a preferred solution, the water cold-storage tank is further connected to the absorption-type water chiller group for storing the cooling water of the absorption-type water chiller group.

As a preferred solution, the water cold-storage tank further conducts the heat exchange with the coolant distribution unit through plate heat exchanger unit.

As a preferred solution, the PCM cold-storage tank is connected in parallel to the water cold-storage tank.

Compared with the prior art, the present disclosure has beneficial effects as follows.

In the present disclosure, based on the principle of energy gradient utilization, the waste heat, generated from electrical energy during processes of calculation, conversion, and storage, is coupled to a high-temperature heat pump, a pressurized/pressure-less heat storage system, and a steam generation system, to achieve cooling and industrial steam/hot water supply of data centers and energy storage power stations. In the meantime, the configuration capacity of UPS (uninterruptible power supply) and backup diesel generator system is reduced by the pressurized/pressure-less heat storage system and absorption (adsorption) heat pump, resulting in lower investment. Moreover, the temperature of the typical cold-storage tanks in the data centers is 4° C.-12° C., and the temperature difference is about 7-8° C. for cold storage, which can only be used in the chilled water system. However, in the application scenario of the present disclosure, the liquid cooling part accounts for more than 70% of the total cooling load in the computer room, while the air cooling part accounts for 10%-30% of the total cooling load. The cooling capacity of the cold-storage tank can be used simultaneously in the cooling-water and chilled-water systems under the switching of the plate heat exchanger unit, wherein the temperature can be ranged from 4° C.-40° C. to reach a use temperature difference more than 30° C., which is equivalent to increasing the capacity of cold energy to more than 4 times of the original capacity with the same cold-storage volume, thus greatly improving the reliability of the system. In addition, the system is equipped with a variety of cold and heat storage tanks, which can use low valley electricity or intermittent waste heat of energy storage power stations to achieve peak-load shifting and reduce daily operating costs. In case of accidents, the heat storage tanks can also be used as an energy source for the absorption-type water chiller groups to generate the cold capacity with low electrical power.

BRIEF DESCRIPTION OF DRAWINGS

FIG. 1 is a schematic diagram of the architecture of a heat-and-cold recovery system based on liquid cooling data center according to an embodiment of the present disclosure.

DETAILED DESCRIPTION OF EMBODIMENTS

To more clearly illustrate embodiments of the present disclosure, specific embodiments of the present disclosure will be described below with the accompanying drawings. The accompanying drawings in the following description are obviously only some embodiments of the present disclosure, and other drawings and other embodiments may be obtained from these accompanying drawings without inventive effort to those of ordinary skill in the art.

As shown in FIG. 1, the heat-and-cold recovery system based on liquid cooling data center in the embodiment of the present disclosure comprises a high-temperature heat pump 1, a pressure-less heat-storage tank 2, a pressurized heat-storage tank 3, an absorption-type water chiller group 4, a water cold-storage tank 5, and a PCM cold-storage tank 13.

The liquid cooling data center is provided with a computer-room liquid-cooling region I and a computer-room air-cooling region II; a first circulating heat-exchange loop is formed by a liquid-cooling cabinet RACK in the computer-room liquid-cooling region I and a coolant distribution unit (abbreviated as CDU) III; a second circulating heat-exchange loop is formed by the coolant distribution unit Ill and a first cooling tower VI, for the heat exchange conducted by the first circulating heat-exchange loop and the second circulating heat-exchange loop; and liquid-cooling coolant is applied in the first circulating heat-exchange loop, and cooling water is applied in the second circulating heat-exchange loop.

Further, a third circulating heat-exchange loop is formed by the computer-room air-cooling region II and the compression-type water chiller group V, and a fourth circulating heat-exchange loop is formed by the compression-type water chiller group V and a second cooling tower VI, for the heat exchange conducted by the third circulating heat-exchange loop and the fourth circulating heat-exchange loop, wherein the cooling water is applied in both the third circulating heat-exchange loop and the fourth circulating heat-exchange loop; and the compression-type water chiller group is a centrifugal compression-type water chiller group or a screw compression-type water chiller group, both of which are supplied with electrical energy.

The part of heat storage and heat supply of the heat-and-cold recovery system of the embodiment of the present disclosure is described in detail below.

In the embodiment of the present disclosure, the high-temperature heat pump 1 and the coolant distribution unit Ill form a fifth circulating heat-exchange loop, and the cooling water in the fifth circulating heat-exchange loop conducts the heat exchange with the liquid-cooling coolant in the first circulating heat-exchange loop.

In the embodiment of the present disclosure, the high-temperature heat pump 1 and the pressure-less heat-storage tank 2 forms a sixth circulating heat-exchange loop, and the sixth circulating heat-exchange loop conducts the heat exchange with the fifth circulating heat-exchange loop, wherein the pressure-less heat-storage tank 2 is provided with a hot-water output interface for outputting hot water to the hot-water user side, thus enabling the reuse of residual heat.

Specifically, the pressure-less heat-storage tank 2 of the embodiment of the present disclosure is provided with an upper water distributor and a lower water distributor therein; and the upper water distributor and the lower water distributor are the input and the output of the sixth circulating heat-exchange loop corresponding to the pressure-less heat-storage tank, respectively. Therefore, circulation between the high-temperature heat pump 1 and pressure-less heat-storage tank 2 is achieved, which improves the uniformity of hot-water temperature distribution in pressure-less heat storage tank 2.

Further, in the embodiment of the present disclosure, the hot-water output interface of the pressure-less heat-storage tank 2 is further connected to the pressurized heat-storage tank 3 through a first circulating pump set 6 and a pipeline heater 7 in sequence; and the pressurized heat-storage tank 3 is used to output steam.

Specifically, the pressurized heat-storage tank 3 is divided into a steam region 3-1 and a hot-water region 3-2 that are communicated with each other, in which the steam region 3-1 is located above the hot-water region 3-2 and the steam output interface is communicated to the steam region, that is to say, the steam output interface is the interface formed in the steam region. The hot-water region 3-2 of the pressurized heat-storage tank 3 is disposed with an upper-annular water distributor and a lower-annular water distributor; and the upper-annular water distributor is connected to the pipeline heater 7 for inputting and the lower-annular water distributor is connected to the second circulating pump set 8 for outputting. Moreover, the pressurized heat-storage tank 3 is also provided with a water-refilling inlet 30, which controls the liquid level of pressurized storage tank according to the operating strategy.

The above-mentioned water distributor and annular water distributor can be arranged by referring to the prior art and will not be repeated here.

In the embodiment of the present disclosure, steam output interface of the pressurized heat-storage tank 3 is connected to a steam generator 9, a gas-liquid separator 10, and a gas distributing cylinder 11 in sequence, for supplying to the steam user side to use.

In addition, both ends of the steam generator 9 are connected in parallel to direct by-passes, which are used when the steam generator is not required. Specifically, the selection can be based on the temperature sensor and pressure sensor installed in the steam region 3-1.

The pressurized heat-storage tank 3 of the embodiment of the present disclosure is further connected to the absorption-type water chiller group 4 through a second circulating pump set 8 and forms a seventh circulating heat-exchange loop with the pressure-less heat-storage tank 2 through the absorption-type water chiller group 4, wherein the second circulating pump set 8 is connected in parallel with the first circulating pump set 6.

In the embodiment of the present disclosure, the absorption-type water chiller group 4 and the computer-room air-cooling region II form an eighth circulating heat-exchange loop, and the eighth circulating heat-exchange loop conducts the heat exchange with the seventh circulating heat-exchange loop. In addition, the hot water output of the absorption-type water chiller group 4 is capable of being supplied directly to the hot-water user side.

The compression-type water chiller group V of the embodiment of the present disclosure is connected to a water cold-storage tank 5; and the water cold-storage tank 5 is used to store the cooling water from the compression-type water chiller group, for heat exchange to the coolant distribution unit III and/or the computer-room air-cooling region II, so as to ensure the cooling (refrigeration) of the computer-room liquid-cooling region I and the computer-room air-cooling region II under extreme conditions.

The water cold-storage tank 5 of the embodiment of the present disclosure is further connected to the absorption-type water chiller group 4 for storing the cooling water of the absorption-type water chiller group 4. In addition, the water cold-storage tank 5 further conducts the heat exchange with the coolant distribution unit Ill through plate heat exchanger unit 12, which is connected to the cooling water pipeline of the coolant distribution unit III. According to actual needs, a by-pass can also be arranged correspondingly to the plate heat exchanger unit 12 and directly connected to a cooling water channel of the coolant distribution unit III.

The water cold-storage tank 5 of the embodiment of the present disclosure is further connected in parallel with a PCM cold-storage tank 13, for enhancing the capacity and amount of cold storage.

Due to the relatively large number of control valves involved in the embodiment of the present disclosure, they are not detailed individually in the embodiment of the present disclosure; and the control valves are correspondingly installed according to each input and each output of each device, respectively. Specific reference can be made to FIG. 1, which is not repeated here.

The working principle of the heat-and-cold recovery system based on liquid cooling data center of the embodiment of the present disclosure is as follows.

The system is applied to the liquid cooling data centers (or to the liquid-cooling energy storage power stations) and provided with a high-temperature heat pump, a steam generator, a pipeline heater, heat storage units (atmospheric heat-storage tank, pressurized heat-storage tank), cold storage units (water cold-storage tank, PCM cold-storage tank), a conventional cold-source cooling tower, a compression-type water chiller group, an absorption-type water chiller group, and plate heat exchanger units. It is able to turn off the cooling source system such as cooling tower or refrigeration units in daily operation, adopt the high-temperature heat pump to switch on heating mode and produce cold and hot medium at the same time. A cold end is able to replace the original cooling tower so that the liquid-cooling coolant system is continuously cooled; and a hot end is able to produce high-temperature hot water/steam, which can be directly supplied to the external heat users for use. When the load demand of the external heat users is low and the heat storage units of the system reach their limits, the absorption-type water chiller group switches on the cooling mode, and the produced cold capacity is able to be stored in the water cold-storage tank, and the PCM cold-storage tank. According to the heat storage strategy, in the heat peak/power peak periods, the cooling is performed by using cold capacity in cold-storage tanks or cooling towers, or the cooling is performed by using heat in heat storage units through absorption-type water chiller group, so as to achieve peak-load shifting, thus reducing energy consumption during peak periods of electricity. In case of equipment failure, after the dual power supply switchover and before the diesel generator runs at full power, heat storage in the heat storage units is used for cooling by using the absorption-type water chiller group, or the cold capacity of the cold storage units is used by the plate heat exchanger units or the by-pass of the plate heat exchanger units for direct or indirect heat exchange, so as to meet the system cooling needs.

In the application scenario of the embodiment of the present disclosure, the residual heat is produced year-round, the cooling load is required year-round for 8760 hours, and the external supply load is mainly steam and/or hot water.

The heat generation in the data center is stable all year round, and the heat generation in the energy storage power station is able to be periodical with the charging and discharging load. To maximize the use of the residual heat, both must be decoupled using energy storage units, making it possible to minimize the impact of external-load fluctuations on the cooling system.

The embodiment of the present disclosure is provided with both the heat storage tank and cold storage tank, in the case of a large external heat load, the priority is given to heat storage, in which the high-temperature heat pump is turned on, the absorption-type water chiller group is turned off, and the pressure-less heat-storage tank supplies hot water. The hot water is capable of being passed through the first circulating pump set and the pipeline heater to raise the grade of hot water and the temperature of hot water, so as to store more energy in the pressurized heat-storage tank.

When the external heat load is small, in the case that both the pressure-less heat-storage tank and the pressurized heat-storage tank are full, the priority is given to cold storage, in which the high-temperature heat pump is turned on, the absorption-type water chiller group is turned on, and the water cold-storage tank and the PCM cold-storage tank perform cold storage.

In addition, when the external heat load is small and the pressure-less heat-storage tank, the pressurized heat-storage tank, the water cold-storage tank, and the PCM cold-storage tank are all full, the high-temperature heat pump is turned off, the absorption-type water chiller group is turned off, the first cooling tower is turned on, and the cooling of the computer-room liquid-cooling region is provided by the cold source from the first cooling tower.

During the peak electricity price, the compression-type water chiller group can be turned off and the cooling for the computer-room air-cooling region can be provided by the cold source from the cold storage units.

In the embodiment of the present disclosure, the process of turning on the high-temperature heat pump and the absorption-type water chiller group is required to take into account the peak and valley periods of the electricity price and the external network load requirements, to achieve the peak-load shifting, which reduces the cost and energy consumption.

The heat storage units of the embodiment of the present disclosure can be configured in two ways: below 95° C., using an open-type pressure-less heat-storage tank; above 95° C., using a closed-type pressurized heat-storage tank.

At the beginning of the heat release from the pressurized heat-storage tank of the embodiment of the present disclosure, it is able to enter from the by-pass of the steam generator into the gas-liquid separator and sent out to the steam user through a gas distributing cylinder. At the later stage of heat release of the pressurized heat-storage tank, since its own heat release requires an additional heat source to continuously release heat, it is necessary to switch the first circulating pump set and the second circulating pump set, close the hot-water output interface of the pressure-less heat-storage tank, open the control valve corresponding to the output of the lower-annular water distributor of the pressurized heat-storage tank, use the pipeline heater to continuously heat, and heat the saturated water in the pressurized heat-storage tank to flash to produce saturated steam. According to the steam quality requirements of the external network, the steam generator is able to be integrated into the system or cut out of the system to adjust the dryness and temperature of the steam.

The embodiment of the present disclosure applies the high-temperature heat pump as well as the absorption-type water chiller group. The absorption-type water chiller group in normal operation uses the refrigeration mode to provide the cooling load of the entire system, maintaining the on-duty state due to its low efficiency and low energy consumption; while the compression-type water chiller group is featured in high efficiency, which is used for major loads. When a power failure occurs, the compression-type water chiller group stops/or reduces the load, the absorption-type water chiller group increases the load, and the second cooling tower turns from the standby state to the start state to ensure cooling needs.

The heat storage tank in the embodiment of the present disclosure is provided with a flash system, and the flash tank can be a split structure; and if it is a pressurized tank, it can also be integrated with the pressurized tank.

In the event of an accident, when the power supply loses power, and UPS switches, and before the internal combustion generator set is used as a backup power supply to start with a full load, the high-temperature heat pump, the compression-type water chiller group, the pipeline heater, the steam generator, and other high-power hot backups are turned off. The absorption-type water chiller group is turned on, and the air-cooling portion of the liquid cooling data center accounts for 10%-30% of the total cooling load. Under the switch by the plate heat exchanger units, the cold capacity of the cold storage tank is able to be simultaneously used in the cooling water and chilled water systems (that is, the chilled water output of the absorption-type water chiller group or the compression-type water chiller group). The usable temperature ranges from 4° C. to 40° C., reaching a use temperature difference more than 30° C.

In the embodiment of the present disclosure, the liquid-cooling portion of the computer room in the liquid cooling data center accounts for a range of 70-90% of the total cooling load, and the air-cooling portion accounts for 10%-30% of the total cooling load. In cases of extreme accident, when the temperature of the cold storage tank rises above 25° C., the cold storage tank is no longer able to discharge cold to the chilled water system and the FCU is no longer available; and it requires to turn on the absorption-type water chiller group, and/or the compression-type water chiller group to meet the cooling load of the air-cooling region. In more extreme cases, when the temperature of the cold storage tank rises above 40° C., the chilled water system and the cooling water system are not able to exchange heat through the plate heat exchanger units, the plate heat exchanger units can be switched to the by-pass, and the chilled water system directly enters the cooling water system to cool the computer-room liquid-cooling region. At this time, according to the cooling strategy, the cooling tower in the computer-room liquid-cooling region is turned on, and the cooling tower is used to cool the liquid-cooling region, so as to achieve synchronized cooling.

The above description is only a detailed description of the preferred embodiments and principles of the present disclosure, and to a person of ordinary skill in the art, there will be changes in specific implementations based on the ideas provided by the present disclosure, and these changes shall also be considered as the scope of protection of the present disclosure.

What is claimed is:

1. A heat-and-cold recovery system integrated into a liquid cooling data center, wherein the liquid cooling data center is provided with a computer-room liquid-cooling region and a computer-room air-cooling region, wherein
   a first circulating heat-exchange loop is formed by the computer-room liquid-cooling region and a coolant distribution unit, and a second circulating heat-exchange loop is formed by the coolant distribution unit and a first cooling tower, wherein a heat exchange is conducted by the first circulating heat-exchange loop and the second circulating heat-exchange loop; and
   a third circulating heat-exchange loop is formed by the computer-room air-cooling region and a compression water chiller group, and a fourth circulating heat-exchange loop is formed by the compression water chiller group and a second cooling tower, wherein a heat exchange is conducted by the third circulating heat-exchange loop and the fourth circulating heat-exchange loop,
   wherein the heat-and-cold recovery system comprises:
   a high-temperature heat pump,
   a pressure-less heat-storage tank,
   a pressurized heat-storage tank,
   an absorption water chiller group, and
   a water cold-storage tank,
   wherein the high-temperature heat pump and the coolant distribution unit form a fifth circulating heat-exchange loop, and the fifth circulating heat-exchange loop conducts a heat exchange with the first circulating heat-exchange loop;
   the high-temperature heat pump and the pressure-less heat-storage tank form a sixth circulating heat-exchange loop, and the sixth circulating heat-exchange loop conducts a heat exchange with the fifth circulating heat-exchange loop, wherein the pressure-less heat-storage tank is provided with a hot-water output interface for outputting hot water to a hot-water user side;
   the hot-water output interface of the pressure-less heat-storage tank is further connected to the pressurized heat-storage tank through a first circulating pump set and a pipeline heater in sequence; and the pressurized heat-storage tank is configured to output steam;
   the pressurized heat-storage tank is further connected to the absorption water chiller group through a second circulating pump set and forms a seventh circulating heat-exchange loop with the pressure-less heat-storage tank through the absorption water chiller group, wherein the second circulating pump set is connected in parallel with the first circulating pump set;
   the absorption water chiller group and the computer-room air-cooling region form an eighth circulating heat-exchange loop, and the eighth circulating heat-exchange loop conducts a heat exchange with the seventh circulating heat-exchange loop; and
   the compression water chiller group is connected to a water cold-storage tank, and the absorption water chiller group is connected to the water cold-storage tank; and the water cold-storage tank is configured to store a cooling water from the compression water chiller group and the absorption water chiller group for heat exchange to the coolant distribution unit and/or the computer-room air-cooling region.

2. The heat-and-cold recovery system integrated into the liquid cooling data center according to claim 1, wherein;
   a steam output interface of the pressurized heat-storage tank is connected to a steam generator, a gas-liquid separator, and a gas distributing cylinder in sequence, for supplying to a steam user side.

3. The heat-and-cold recovery system integrated into the liquid cooling data center according to claim 2, wherein:
   direct by-passes are connected in parallel to both ends of the steam generator.

4. The heat-and-cold recovery system integrated into the liquid cooling data center according to claim 1, wherein:
   the pressurized heat-storage tank is divided into a steam region and a hot-water region,
   wherein the steam region is located above the hot-water region, and
   a steam output interface communicates with the steam region;
   the hot-water region of the pressurized heat-storage tank is provided with an upper-annular water distributor and a lower-annular water distributor,
   wherein the upper-annular water distributor is connected to the pipeline heater;; and
   the lower-annular water distributor is connected to the second circulating pump set.

5. The heat-and-cold recovery system integrated into the liquid cooling data center according to claim 1, wherein; the pressurized heat-storage tank is provided with a water-refilling inlet.

6. The heat-and-cold recovery system integrated into the liquid cooling data center according to claim 1, wherein; the pressure-less heat-storage tank is provided with an upper water distributor and a lower water distributor therein; and the upper water distributor and the lower water distributor are an input and an output of the sixth circulating heat-exchange loop corresponding to the pressure-less heat-storage tank, respectively.

7. The heat-and-cold recovery system integrated into the liquid cooling data center according to claim 1, wherein: the water cold-storage tank is further connected to the absorption water chiller group for storing a cooling water of the absorption water chiller group.

8. The heat-and-cold recovery system integrated into the liquid cooling data center according to claim 7, wherein; the water cold-storage tank is connected in parallel to a PCM cold-storage tank.

9. The heat-and-cold recovery system integrated into the liquid cooling data center according to claim 1, wherein: the water cold-storage tank further conducts a heat exchange with the coolant distribution unit through a plate heat exchanger unit.

10. The heat-and-cold recovery system integrated into the liquid cooling data center according to claim 9, wherein; the water cold-storage tank is connected in parallel to a PCM cold-storage tank.

11. The heat-and-cold recovery system integrated into the liquid cooling data center according to claim 1, wherein: the water cold-storage tank is connected in parallel to a PCM cold-storage tank.

12. The heat-and-cold recovery system integrated into the liquid cooling data center according to claim 1, wherein; the compression water chiller group is a centrifugal compression water chiller group or a screw compression water chiller group.

13. An apparatus comprising a heat-and-cold recovery system and a liquid cooling data center, wherein the heat-and-cold recovery system is integrated into the liquid cooling data center, wherein the liquid cooling data center is provided with a computer-room liquid- cooling region and a computer-room air-cooling region, wherein a first circulating heat-exchange loop is formed by the computer-room liquid-cooling region and a coolant distribution unit, and a second circulating heat-exchange loop is formed by the coolant distribution unit and a first cooling tower, wherein a heat exchange is conducted by the first circulating heat-exchange loop and the second circulating heat-exchange loop; and a third circulating heat-exchange loop is formed by the computer-room air-cooling region and a compression water chiller group, and a fourth circulating heat-exchange loop is formed by the compression water chiller group and a second cooling tower, wherein a heat exchange is conducted by the third circulating heat-exchange loop and the fourth circulating heat-exchange loop, wherein the heat-and-cold recovery system comprises:
a high-temperature heat pump,
a pressure-less heat-storage tank,
pressurized heat-storage tank,
an absorption water chiller group, and
a water cold-storage tank,
wherein the high-temperature heat pump and the coolant distribution unit form a fifth circulating heat-exchange loop, and the fifth circulating heat-exchange loop conducts a heat exchange with the first circulating heat-exchange loop;

the high-temperature heat pump and the pressure-less heat-storage tank form a sixth circulating heat-exchange loop, and the sixth circulating heat-exchange loop conducts a heat exchange with the fifth circulating heat-exchange loop, wherein the pressure-less heat-storage tank is provided with a hot-water output interface for outputting hot water to a hot-water user side;

the hot-water output interface of the pressure-less heat-storage tank is further connected to the pressurized heat-storage tank through a first circulating pump set and a pipeline heater in sequence; and the pressurized heat-storage tank is configured to output steam;

the pressurized heat-storage tank is further connected to the absorption water chiller group through a second circulating pump set and forms a seventh circulating heat-exchange loop with the pressure-less heat-storage tank through the absorption water chiller group, wherein the second circulating pump set is connected in parallel with the first circulating pump set;

the absorption water chiller group and the computer-room air-cooling region form an eighth circulating heat-exchange loop, and the eighth circulating heat-exchange loop conducts a heat exchange with the seventh circulating heat-exchange loop; and the compression water chiller group is connected to a water cold-storage tank, and the absorption water chiller group is connected to the water cold-storage tank; and the water cold-storage tank is configured to store a cooling water from the compression water chiller group and the absorption water chiller group for heat exchange to the coolant distribution unit and/or the computer-room air-cooling region.

* * * * *